United States Patent [19]
Grewal et al.

[11] Patent Number: 5,597,438
[45] Date of Patent: Jan. 28, 1997

[54] ETCH CHAMBER HAVING THREE INDEPENDENTLY CONTROLLED ELECTRODES

[75] Inventors: Virinder S. Grewal, Fishkill, N.Y.; Volker B. Laux, Munich, Germany

[73] Assignee: Siemens Aktiengesellschaft, Munich, Germany

[21] Appl. No.: 527,909

[22] Filed: Sep. 14, 1995

[51] Int. Cl.⁶ .................................................. H01L 21/00
[52] U.S. Cl. ................. 156/345; 156/643.1; 204/298.34; 118/723 I; 216/68
[58] Field of Search .................... 156/345, 643.1; 204/298.34; 118/723 I; 216/68

[56] References Cited

U.S. PATENT DOCUMENTS

| | | | |
|---|---|---|---|
| 4,349,409 | 9/1982 | Shibayama et al. | 156/643.1 |
| 4,844,775 | 7/1989 | Keeble | 156/643 |
| 5,013,400 | 5/1991 | Kurasaki et al. | 156/643 |
| 5,015,331 | 5/1991 | Powell | 156/643 |
| 5,039,376 | 8/1991 | Zukotynski et al. | 156/643 |
| 5,061,359 | 10/1991 | Babu et al. | 204/298.07 |
| 5,102,523 | 4/1992 | Beisswenger et al. | 204/298.33 |
| 5,157,000 | 10/1992 | Elkind et al. | 437/225 |
| 5,252,178 | 10/1993 | Moslehi | 156/643.1 |
| 5,449,432 | 9/1995 | Hanawa | 156/643.1 |
| 5,468,296 | 11/1995 | Patrick et al. | 118/723 MP |

*Primary Examiner*—R. Bruce Breneman
*Assistant Examiner*—Michael E. Adjodha
*Attorney, Agent, or Firm*—Donald B. Paschburg

[57] ABSTRACT

An etch chamber for anisotropic and selective etching of a semiconductor wafer contains a dielectric window and an externally located first electrode member adjacent to the dielectric window for generating a plasma within the chamber. A second electrode member is located within the chamber for exciting the plasma generated by the first electrode member. A third electrode is located between the first electrode member and the dielectric window for sputtering the dielectric window to provide sidewall passivation for anisotropic and selective etching of a semiconductor wafer located within said chamber. Each electrode member is powered by its own separate RF generator. This arrangement enables the independent control of each of the three electrode members to optimize the etching of the semiconductor wafer located within the chamber.

20 Claims, 1 Drawing Sheet

ETCH CHAMBER HAVING THREE INDEPENDENTLY CONTROLLED ELECTRODES

BACKGROUND OF THE INVENTION

1. Field of the Invention

The present invention relates generally to semiconductor wafer fabrication and more particularly to a three electrode etch chamber for selective and anisotropic etching of polycrystalline silicon and metal conductors in semiconductor wafer fabrication.

2. Description of the Prior Art

Polycrystalline silicon is used widely as a gate material in semiconductor wafer fabrication. The modern trend with respect to such technology, is to go to greater and greater device densities which in turn necessitates smaller minimum feature dimensions which must be precisely maintained during semiconductor wafer processing. This is achieved using anisotropic and selective etching techniques which utilize high density plasmas provided at relatively low pressures.

As is well known in the art, plasma etching employs a plasma coupled to an RF voltage to create a chemically active etchant that forms a volatile etching product with the unprotected layers of a substrate. This technique is made possible by the existence of suitable combinations of substrate and etching gas. Such combinations are available for the majority of the films used to fabricate semiconductor devices. Examples of typical etching gases include chlorine and fluorine compounds which are respectively available in the form of $CCl_4$ and $CF_4$. These compounds have been adapted for etching polysilicon, $SiO_2$ $Si_3N_4$, and metals. For example, fluorine radicals will react with silicon to produce a volatile silicon tetrafluoride etching product. Oxygen containing plasmas are commonly employed to etch organic films including resist or to substantially increase the etching rate of the etch gas.

Plasma etching is generally performed in an etch chamber as shown in FIG. 1. The prior art etch chamber 10 of FIG. 1 comprises a sidewall 12 and a dielectric window 14 made from an ultra pure quartz plate. An induction coil 16 is located above the dielectric window 14 of the chamber 10 and is powered by an RF generator 18. Located within the chamber 10 is an electrically conductive wafer holding mechanism 22 commonly known as a chuck. A second RF generator 20 powers the wafer chuck. A dense inductively coupled plasma is generated by powering the coil 16 with the generator 18. The second generator 20 is used to generate an RF bias on the wafer 24 and this causes ion bombardment to the wafer surface which is necessary for anisotropic reactive ion etching (R.I.E.).

Etching in the chamber described above, however, does not always provide the desired anisotropy.

For example, the fabrication of a polysilicon gate by plasma etching in the chamber of FIG. 1 often produces a gate with sloping or undercut sidewalls. This is caused by selectivity problems. In particular, selectivity is required to pattern polysilicon gate electrodes without removing the thin underlying gate oxide, since the etching ratios needed increases in both instances as the devices become smaller. More specifically, a higher degree of selectivity for silicon dioxide relative to, silicon is needed because the junction depth decreases faster than the thickness of the field oxide. Further, a higher degree of selectivity for silicon relative to silicon dioxide is a must because the thickness of the gate oxide decreases at a faster rate than the thickness of the gate electrode. Additionally, the required selectivity depends on the thicknesses of the etched and underlying films as well as on the topography produced by earlier processing steps.

Hence, in order to obtain anisotropy during plasma etching in the chamber of FIG. 1, junction sidewall passivation is needed. This is achieved in the prior art chamber of FIG. 1 by properly selecting the earlier described etch products. However, even with the proper selection, the concentration of these etch products depletes near the end of the etch process, thus, slowing down the build-up of the sidewall passivation. In many cases, this causes notching and a reduced selectivity to the underlying layer such as the gate oxide. Thus, there is a need to control the formation of sidewall passivation using something other than careful selection of the etch products.

It is, therefore, a primary object of the present invention to provide an improved etch chamber which enables the formation of the sidewall passivation to be more accurately controlled.

SUMMARY OF THE INVENTION

An etch chamber for anisotropic and selective etching of a semiconductor wafer generally comprises an enclosure having a dielectric window. First electrode means are provided external to the enclosure and adjacent to the dielectric window for inductively coupling an RF voltage into a process gas to be introduced into the enclosure, in order to convert the gas into a plasma.

Second electrode means are provided within the enclosure for supporting at least one semiconductor wafer to be etched and exciting the plasma generated by said first electrode means.

Third electrode means are provided between the first electrode means and the dielectric window for sputtering the dielectric window to provide sidewall passivation for anisotropic and selective etching of the semiconductor wafer. Further, the first, second, and third electrode means are capable of being independently controlled to optimize the etching of the semiconductor wafer.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The etch chamber of the present invention is especially intended for anisotropic and selective etching of semiconductor gate conductor stacks and metal lines. It should be understood, however, that the etch chamber of the present invention is also useful for etching other types of semiconductor structures.

Figure 1:
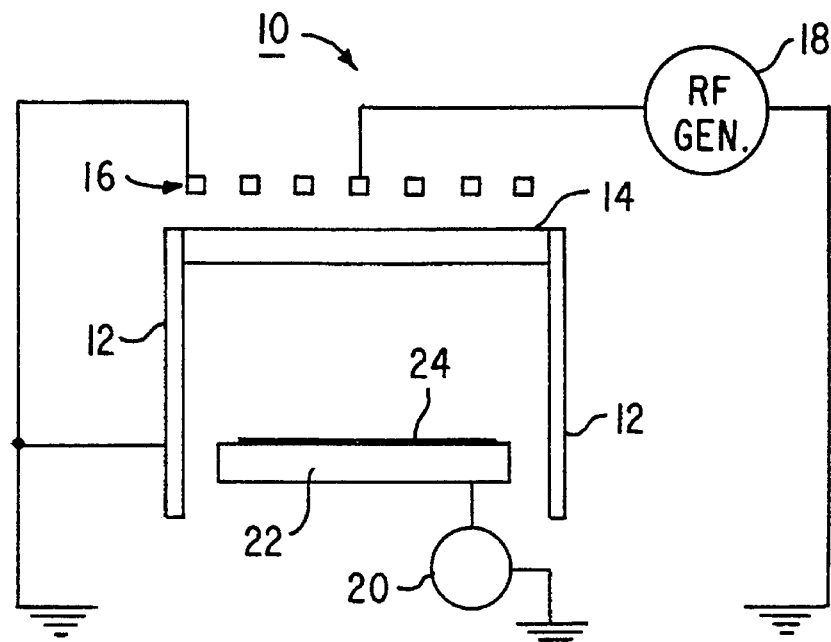
FIG. 1 is a schematic view of a prior art etch chamber.
Figure 2:
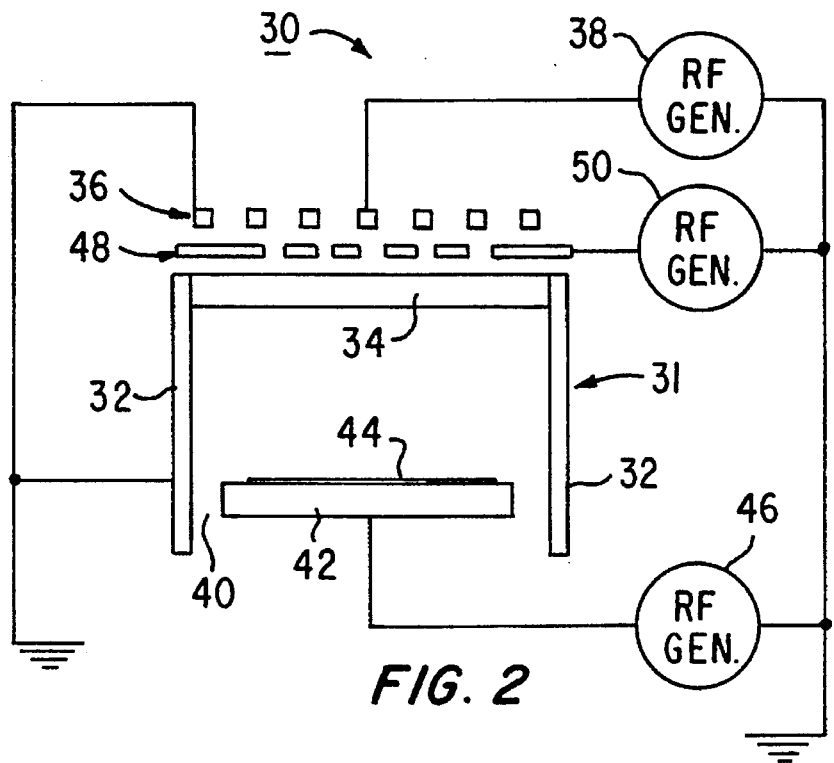
FIG. 2 is a schematic view of the etch chamber of the present invention.

Referring to FIG. 2, there is shown an exemplary embodiment of the etch chamber of the present invention designated by the numeral 30. The etch chamber 30 generally comprises a conventionally designed enclosure 31 having a continuous sidewall 32 and a planar dielectric window 34 made from an ultra pure quartz plate. The enclosure 31 is fabricated from a conductive metal, such as aluminum although, it can be fabricated from any other suitable known material.

Still referring to FIG. 2, the etch chamber 30 of the present invention includes three independently controlled electrodes 36, 42, 48 which enable very selective and anisotropic etching of the gate conductor stacks and metal lines on semiconductor wafers. More specifically, the electrode 36 comprises a spiral-shaped induction coil which is oriented above the dielectric window 34 of the enclosure 31. The electrode 36 is powered by an RF generator 38 which is coupled thereto. Located within the interior of the enclosure 31 is the electrode 42 which comprises a conventional electrically conductive chuck for holding one or more semiconductor wafers 44. The chuck 42 not only supports the wafer 44 but also operates to maintain the temperature of the wafer at a constant level during etching. A second RF generator 46 is coupled to the chuck 42 to power the chuck 42 and the wafer 44. The electrode 48 enables independent control over the formation of the sidewall passivation and comprises a novel grid-shaped electrode 48. The grid-shaped electrode 48 is manufactured from any suitable conductive material. The grid-shaped electrode 48 is oriented between the induction coil 36 and the dielectric window 34 of the chamber 30. A third RF generator 50 is coupled to the grid-shaped electrode 48 to provide it with its own a separately controlled RF energy source.

In operation to etch a semiconductor wafer 44, the RF generator 38, the induction coil 36 and the dielectric window 34 coact to inductively couple an RF voltage into a selected process gas that has been guided into the enclosure 31 at location 40. Examples of such gases include hydrogen chloride (HCL) chlorine ($Cl_2$), nitrogen ($N_2$) and oxygen ($O_2$) or any other suitable etching gas. The inductive coupling converts the selected gas or gases into an inductive plasma. The second RF generator 46 enables the chuck and wafer to be separately driven to further excite the inductive plasma created by the induction coil 36 and dielectric window 34. The RF generator 50 powering the grid electrode 48 can be selectively controlled to sputter the dielectric window 34 of the chamber 30 to generate the additional sidewall passivation required for anisotropically etching the wafer 44 when the concentration of the etch products depletes near the end of the main etch, thus, preventing the slow down of the sidewall passivation. This also enhances the selectivity to the underlying oxide layer of the wafer 44.

It should be understood that the embodiment described herein is merely exemplary and that a person skilled in the art may make many variations and modifications to the embodiment utilizing functionally equivalent elements to those described herein. Any and all such variations or modifications as well as others which may become apparent to those skilled in the art, are intended to be included within the scope of the invention as defined by the appended claims.

We claim:

1. An etch chamber for anisotropic and selective etching of a semiconductor wafer, comprising:

an enclosure having a dielectric window;

first electrode means located externally to said enclosure and adjacent to said dielectric window for inductively coupling an RF voltage into a process gas that has been introduced into said enclosure and converting said gas into a plasma;

second electrode means located within said enclosure for supporting at least one semiconductor wafer to be etched and exciting said plasma generated by said first electrode means; and third electrode means located between said first electrode means and said dielectric window for sputtering said dielectric window to provide sidewall passivation for anisotropic and selective etching of said at least one semiconductor wafer, wherein said first, second, and third electrode means are capable of being independently controlled to optimize the etching of said at least one semiconductor wafer.

2. The etch chamber according to claim 1, wherein said dielectric window comprises a quartz plate.

3. The etch chamber according to claim 1, wherein said semiconductor wafer comprises polysilicon.

4. The etch chamber according to claim 1, wherein said first electrode means is coupled to a first RF generator.

5. The etch chamber according to claim 1, wherein said second electrode means is coupled to a second RF generator.

6. The etch chamber according to claim 1, wherein said third electrode means is coupled to a third RF generator.

7. The etch chamber according to claim 1, wherein said first electrode means comprises an induction coil.

8. The etch chamber according to claim 1, wherein said second electrode means comprises a wafer holding chuck.

9. The etch chamber according to claim 1, wherein said third electrode comprises a grid-shape electrode.

10. An etch chamber for anisotropic and selective etching of a semiconductor wafer, comprising:

an enclosure having a dielectric window;

first electrode means located externally to said enclosure and adjacent to said dielectric window for inductively coupling an RF voltage into a process gas that has been introduced into said enclosure and converting said gas into a plasma;

second electrode means located within said enclosure for supporting at least one semiconductor wafer to be etched and exciting said plasma generated by said first electrode means; and third electrode means located between said first electrode and said dielectric window for sputtering said dielectric window to provide sidewall passivation for anisotropic and selective etching of said at least one semiconductor wafer, RF generator means for supplying an RF energy source to said first, second, and third electrode means, said RF generator means enabling said first, second, and third electrode means to be independently controlled to optimize the etching of said at least one semiconductor wafer.

11. The etch chamber according to claim 10, wherein said RF generator means comprises three separate RF generators, each of said RF generators being coupled to an associated one of said first, second, and third electrode means.

12. The etch chamber according to claim 11, wherein said first electrode means comprises an induction coil.

13. The etch chamber according to claim 12, wherein said second electrode means comprises a wafer holding chuck.

14. The etch chamber according to claim 13, wherein said third electrode comprises a grid-shaped electrode.

15. The etch chamber according to claim 14, wherein said dielectric window comprises a quartz plate.

16. In an etch chamber of the type having an enclosure with a dielectric window, an induction coil located externally to said enclosure and adjacent to said dielectric window for generating a plasma within said enclosure, and a wafer holding chuck located within said enclosure for exciting said plasma generated by said induction coil, said etch chamber being useful for anisotropic and selective etching of a semiconductor wafer, the improvement therewith comprising:

electrode means located between said induction coil and said dielectric window for sputtering said dielectric window to provide sidewall passivation for anisotropic and selective etching of at least one semiconductor wafer to be supported on said chuck in said enclosure.

17. The etch chamber according to claim 16, further comprising RF generator means for supplying an RF energy source to said induction coil, said chuck and said electrode means.

18. The etch chamber according to claim 17, wherein said RF generator means comprises three separate RF generators, each of said RF generators being coupled to an associated one of said induction coil, said chuck, and said electrode means, said RF generator means enabling said induction coil, said chuck, and said electrode means to be independently controlled to optimize the etching of said at least one semiconductor wafer.

19. The etch chamber according to claim 16, wherein said dielectric window comprises a quartz plate.

20. The etch chamber according to claim 16, wherein said electrode means comprise a grid-shaped electrode.

* * * * *